US012426369B2

(12) United States Patent
Luo

(10) Patent No.: US 12,426,369 B2
(45) Date of Patent: Sep. 23, 2025

(54) ARRAY SUBSTRATE, MANUFACTURING METHOD THEREFOR, DISPLAY PANEL, AND DISPLAY DEVICE

(71) Applicant: WUHAN CHINA STAR OPTOELECTRONICS TECHNOLOGY CO., LTD., Wuhan (CN)

(72) Inventor: Chengzhi Luo, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 460 days.

(21) Appl. No.: 17/794,454

(22) PCT Filed: Jun. 8, 2022

(86) PCT No.: PCT/CN2022/097640
§ 371 (c)(1),
(2) Date: Jul. 21, 2022

(87) PCT Pub. No.: WO2023/221198
PCT Pub. Date: Nov. 23, 2023

(65) Prior Publication Data
US 2023/0411400 A1 Dec. 21, 2023

(30) Foreign Application Priority Data
May 17, 2022 (CN) .......................... 202210538672.2

(51) Int. Cl.
H10D 86/60 (2025.01)
G02F 1/1362 (2006.01)
(Continued)

(52) U.S. Cl.
CPC ....... *H10D 86/60* (2025.01); *G02F 1/136222* (2021.01); *H10D 86/0221* (2025.01); *H10D 86/421* (2025.01)

(58) Field of Classification Search
CPC ......... G02F 1/136222; G02F 1/136227; G02F 1/133555; H01L 29/78633; H01L 27/1222; H01L 27/124; H01L 27/127
See application file for complete search history.

(56) References Cited

U.S. PATENT DOCUMENTS

2004/0126608 A1* 7/2004 Gotoh ................. H01L 27/1255
257/E29.147
2015/0130745 A1* 5/2015 Choi .................... G06F 3/0446
345/174
(Continued)

FOREIGN PATENT DOCUMENTS

CN 101840100 A 9/2010
CN 103646966 A 3/2014
(Continued)

OTHER PUBLICATIONS

PCT International Search Report for International Application No. PCT/CN2022/097640, mailed on Feb. 10, 2020, 6pp.
(Continued)

Primary Examiner — Jennifer D. Carruth
(74) Attorney, Agent, or Firm — The Roy Gross Law Firm, LLC; Roy D. Gross

(57) ABSTRACT

The present application discloses an array substrate, a manufacturing method for array substrate, a display panel, and a display device. The array substrate includes a first conductive layer close to an active layer, a third conductive layer disposed on a side of the first conductive layer away from the active layer, and a second conductive layer disposed between two conductive layers. A light reflectivity of the second conductive layer is greater than a light reflectivity of (Continued)

the first conductive layer and the third conductive layer, and an orthographic projection region of the first conductive layer on the substrate is less than an orthographic projection region of the second conductive layer on the substrate.

20 Claims, 2 Drawing Sheets

(51) Int. Cl.
  H10D 86/01 (2025.01)
  H10D 86/40 (2025.01)

(56) References Cited

U.S. PATENT DOCUMENTS

| | | | | |
|---|---|---|---|---|
| 2018/0122877 | A1* | 5/2018 | Beak | H10K 50/814 |
| 2021/0143241 | A1* | 5/2021 | Kim | H10K 59/131 |
| 2022/0077423 | A1* | 3/2022 | Zhang | H10K 59/131 |
| 2023/0009047 | A1* | 1/2023 | Xiao | H10D 30/6728 |
| 2023/0413618 | A1* | 12/2023 | Fang | H10K 59/88 |
| 2024/0032348 | A1* | 1/2024 | Liu | H10K 59/124 |

FOREIGN PATENT DOCUMENTS

| | | | | |
|---|---|---|---|---|
| CN | 104701460 | A | | 6/2015 |
| CN | 104979405 | A | | 10/2015 |
| CN | 105932067 | A | | 9/2016 |
| CN | 106531768 | A | | 3/2017 |
| CN | 107093611 | A | | 8/2017 |
| CN | 107863320 | A | | 3/2018 |
| CN | 108346622 | A | | 7/2018 |
| CN | 109037297 | A | | 12/2018 |
| CN | 110911424 | A | | 3/2020 |
| CN | 113359344 | A | | 9/2021 |
| CN | 114093893 | A | | 2/2022 |
| CN | 114122296 | A | * | 3/2022 ........... H10K 50/824 |
| JP | 2005285976 | A | * | 10/2005 |
| KR | 20090123304 | A | * | 12/2009 |
| KR | 20140102043 | A | * | 8/2014 |
| KR | 20150002279 | A | * | 1/2015 |

OTHER PUBLICATIONS

PCT Written Opinion of the International Search Authority for International Application No. PCT/CN2022/097640, mailed on Feb. 10, 2023, 7pp.

Chinese Office Action issued in corresponding Chinese Patent Application No. 202210538672.2 dated Nov. 28, 2024, pp. 1-13, 25pp.

* cited by examiner

ARRAY SUBSTRATE, MANUFACTURING METHOD THEREFOR, DISPLAY PANEL, AND DISPLAY DEVICE

This application is a National Phase of PCT Patent Application No. PCT/CN2022/097640 having International filing date of Jun. 8, 2022, which claims the benefit of priority of Chinese Patent Application No. 202210538672.2, filed May 17, 2022, the contents of which are all incorporated herein by reference in their entirety.

TECHNICAL FIELD

The present application relates to a technical field of display technology, and particularly relates to an array substrate, a manufacturing method for array substrate, a display panel, and a display device.

BACKGROUND

With continuous progress and development of display technology, liquid crystal displays using thin film transistors (TFT) as switching devices have gained popularity with advantages such as low cost, high resolution, and long service life.

However, TFT-LCD is a passive display panel, and image display needs to be performed in conjunction with the backlight module. A ratio of the light intensity of the backlight source emitted by the backlight module passing through the front and the rear of the TFT-LCD display panel is referred as the light efficiency.

Technical Problems

Currently, only 3-10% of the light efficiency of the TFT-LCD display panel is effectively utilized. An array substrate of the TFT-LCD display panel includes a light-transmitting region and a light-reflecting region, the lights emitted by the backlight source are reflected by the light-reflecting region, and further the lights are reflected to the light-transmitting region by the backlight, thereby improving the light efficiency of the TFT-LCD display panel. Therefore, how to improve the reflectivity of the reflecting region in the array substrate is an urgent problem to be solved at present.

SUMMARY

Embodiments of the present application provide an array substrate, a manufacturing method for array substrate, a display panel, and a display device to improve the reflectivity of the array substrate on the basis of ensuring the electrical connection between a source/drain electrode and an active layer.

According to a first aspect, an embodiment of the present application provides an array substrate, including:
  a substrate;
  an active layer disposed on a side of the substrate, wherein the active layer includes a source/drain overlapping region; and
  a source/drain electrode disposed on a side of the active layer away from the substrate and electrically connected to the active layer at the source/drain overlapping region;
  wherein the source/drain electrode includes a first conductive layer disposed close to the active layer, a third conductive layer disposed on a side of the first conductive layer away from the active layer, and a second conductive layer disposed between the first conductive layer and the third conductive layer; wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate.

According to a second aspect, embodiments of the present application further provide a manufacturing method for array substrate, including:
  providing a substrate;
  forming an active layer on the substrate, wherein the active layer comprises a source/drain overlapping region; and
  forming a source/drain electrode on a side of the active layer away from the substrate, wherein the source/drain electrode is electrically connected to the active layer at the source/drain overlapping region;
  wherein the source/drain electrode includes a first conductive layer disposed close to the active layer, a third conductive layer disposed on a side of the first conductive layer away from the active layer, and a second conductive layer disposed between the first conductive layer and the third conductive layer; wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate.

Beneficial Effects

The array substrate provided by the embodiment of the present application includes a substrate; an active layer disposed on a side of the substrate, wherein the active layer includes a source/drain overlapping region; and a source/drain electrode disposed on a side of the active layer away from the substrate and electrically connected to the active layer at the source/drain overlapping region; wherein the source/drain electrode includes a first conductive layer disposed close to the active layer, a third conductive layer disposed on a side of the first conductive layer away from the active layer, and a second conductive layer disposed between the first conductive layer and the third conductive layer; wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate. The present application improves the reflectivity of the array substrate on the basis of ensuring the electrical connection between the source/drain electrode and the active layer.

BRIEF DESCRIPTION OF THE DRAWINGS

The technical solutions of this application and the benefits thereof will be apparent from the detailed description of the specific embodiments of this application with reference to the accompanying drawings.

DETAILED DESCRIPTION OF THE EMBODIMENTS

The technical solutions in the embodiments of this application will be clearly and completely described below in conjunction with the accompanying drawings in the embodiments of this application. It will be apparent that the described embodiments are only some but not all of the embodiments of the present application. Based on the embodiments of the present application, all other embodiments obtained by a person skilled in the art without creative efforts are within the scope of the present application.

Unless otherwise defined, the technical or scientific terms used in the present disclosure should be of a general meaning to be understood by skilled persons in the field to which the present invention relates. The "first", "second" and similar terms defined in the present disclosure do not represent the sequence, number or the importance, instead merely discriminating different constitutions. Similarly, the terms "one", "a" or "the" and the like do not represent the limits to the number, instead representing at least one. The terms "comprises" or "comprising" and similar words mean that the elements or things appearing before the word encompass the elements or things recited after the word and their equivalents, but do not exclude other elements or things. The terms "connecting" or "connected" are not limited to physical or mechanical connections, but may include electrical connections, whether direct or indirect. The term "up", "down", "left", "right" and the like are only used to represent the relative positional relationship, and when the absolute position of the described object changes, the relative positional relationship may also change accordingly.

Figure 1:
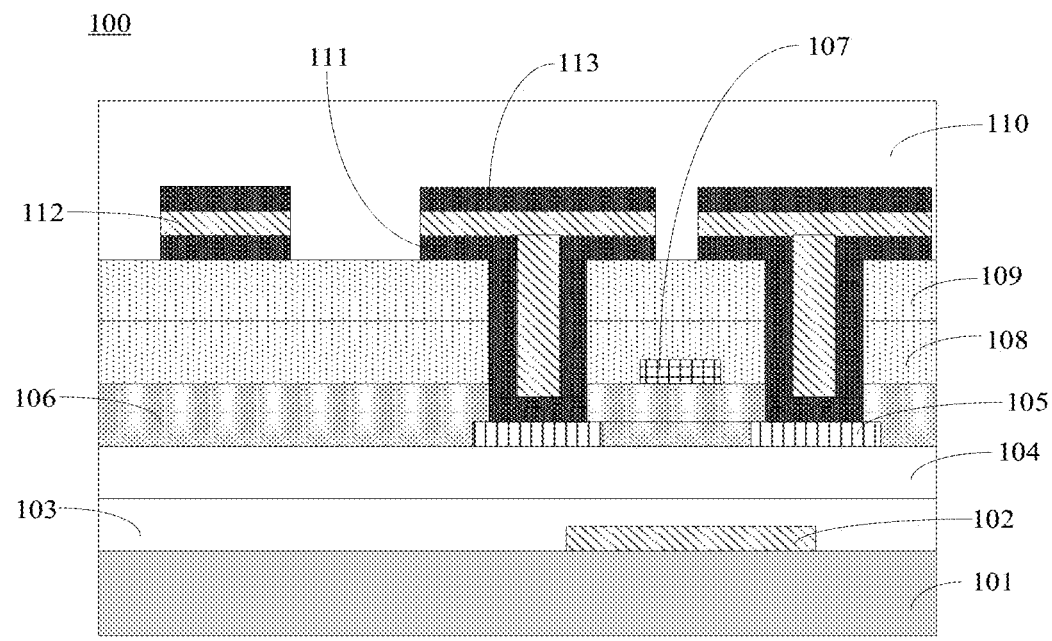
FIG. 1 is a schematic structural diagram of an array substrate in prior art according to an embodiment of the present application.

FIG. 1 is a schematic structural diagram of an array substrate in the prior art according to an embodiment of the present application. The array substrate 100 may include a substrate 101, a first conductive layer 102, a first buffer layer 103, a second buffer layer 104, an active layer 105, a gate insulating layer 106, a gate layer 107, a first interlayer insulating layer 108, a second interlayer insulating layer 109, a flat layer 110, a second conductive layer 111, a third conductive layer 112, and a fourth conductive layer 113. Each of the plurality of film layers 102-113 is provided in a light-reflecting region of the array substrate 100.

The first conductive layer 102 may be made of a metal material such as molybdenum, titanium, or aluminum, wherein the reflectivity of the metal molybdenum is about 52%, the reflectivity of the metal titanium is about 60%, and the reflectivity of the metal aluminum is about 97%. If molybdenum or titanium is selected as a material of the first conductive layer 102, the reflectivity is low, thereby affecting the reflectivity of the array substrate 100. In contrast, it is preferable to select aluminum as the material of the first conductive layer 102, but a high temperature process may cause a sharp increase in the resistance of the aluminum material, and the aluminum material may expand at a high temperature. The expansion of the material is limited due to the presence of the substrate 101. The compressive stress generated by limiting the expansion may be released by atomic diffusion, thereby forming a small mound by diffusion along the grain boundary.

In addition, the second conductive layer 111, the third conductive layer 112, and the fourth conductive layer 113 are overlapped with the source/drain overlapping region of the active layer 105 through vias to realize electrical connection. The second conductive layer 111 and the fourth conductive layer 113 may each use a metal material such as molybdenum or titanium, and the third conductive layer 112 may use an aluminum material. The second conductive layer 111, the third conductive layer 112, and the fourth conductive layer 113 form a three-layer structure. It should be understood that the direct contact of the aluminum material with the active layer 105 produces a large resistance, and therefore, it is necessary to provide the second conductive layer 111 between the third conductive layer 112 and the active layer 105 to prevent the resistance from being too large to cause a short circuit.

As can be seen from the above, the first conductive layer 102 of the array substrate 100 provided in the prior art cannot use an aluminum material having a high reflectivity to improve the reflectivity of the array substrate 100, and the third conductive layer 112 using the aluminum material needs to be in contact with the active layer 105 through the second conductive layer 111 as an interval.

Figure 2:
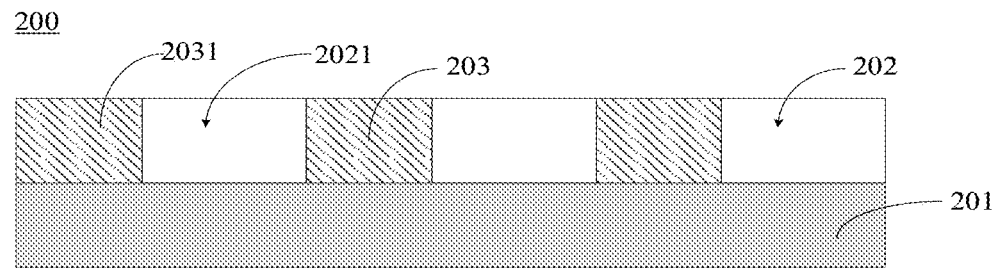
FIG. 2 is a first schematic structural diagram of an array substrate according to an embodiment of the present application.
Figure 3:
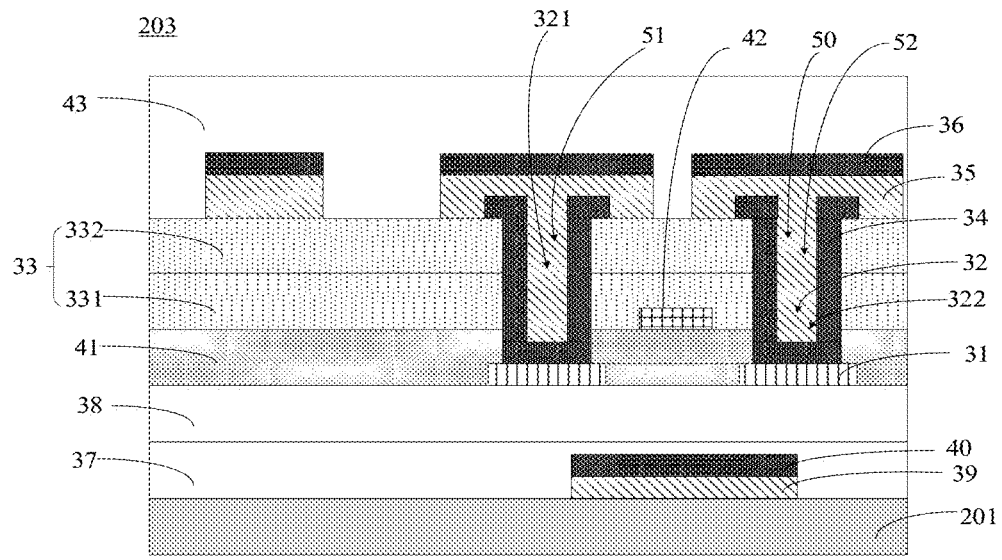
FIG. 3 is a second schematic structural diagram of an array substrate according to an embodiment of the present application.

To solve the problems existing in the prior art, embodiments of the present application provide an array substrate, a manufacturing method for array substrate, a display panel, and a display device. References are made to FIG. 2 and FIG. 3, wherein FIG. 2 is a first schematic structural diagram of an array substrate according to an embodiment of the present application, and FIG. 3 is a second schematic structural diagram of an array substrate according to an embodiment of the present application.

The array substrate 200 may include a substrate 201, and a light-transmitting region 202 and a light-reflecting region 203 disposed on a light-exiting side of the substrate. The light-transmitting region 202 may include a plurality of sub-light-transmitting regions 2021, and the light-reflecting region 203 may include a plurality of sub-light-reflecting regions 2031. The plurality of sub-light-transmitting regions 2021 and the plurality of sub-light-reflecting regions 2031 are sequentially disposed adjacent to each other. That is, the plurality of sub-light-transmitting regions 2021 are sequentially disposed at intervals, the plurality of sub-light-reflecting regions 2031 are sequentially disposed at intervals, and any of the plurality of the sub-light-transmitting regions 2021 is disposed between two adjacent of the plurality of the sub-light-reflecting regions 2031 or any of the plurality of the sub-light-transmitting regions 2021 is disposed adjacent to at least one of the plurality of the sub-light-reflecting regions 2031. An orthographic projection region of each the plurality of sub-light-transmitting regions 2021 on the substrate 201 is greater than an orthographic projection region of each the plurality of sub-light-reflecting regions 2031 on the substrate 201, thereby increasing the size of the sub-light-transmitting region 2021 and increasing the transmittance of the array substrate 200.

The array substrate 200 may include a substrate 201, an active layer 31, and a source/drain electrode, wherein the active layer is disposed on a side of the substrate and includes a source/drain overlapping region. The source/drain electrode is disposed on a side of the active layer 31 away from the substrate 201, and the source/drain overlapping region is electrically connected to the active layer 31. Both the active layer 31 and the source/drain electrode are disposed in the light-reflecting region 203.

The source/drain electrode may include a first conductive layer 34, a second conductive layer 35, and a third conductive layer 36, wherein the first conductive layer 34 is disposed close to the active layer 31, the third conductive layer 36 is disposed on a side of the conductive layer 34 away from the active layer 31, and the second conductive layer 35 is disposed between the first conductive layer 34 and the third conductive layer 36. The light reflectivity of the second conductive layer 35 is greater than the light reflectivity of the first conductive layer 34, and the light reflectivity of the second conductive layer 35 is greater than the light reflectivity of the third conductive layer 36. An orthographic projection region of the first conductive layer 34 on the substrate 201 is less than an orthographic projection region of the second conductive layer 35 on the substrate 201.

The active layer 31 may include a source/drain overlapping region for connecting the source/drain traces, so that electrical connection with the source/drain electrode is achieved by the source/drain traces.

The right-reflecting region 203 may further include a via hole 32, an interlayer insulating layer 33 and a gate insulting layer 41, wherein the gate insulating layer 41 covers the active layer 31, the interlayer insulating layer 33 is disposed on a side of the gate insulating layer 41 away from the active layer 31, and the interlayer insulating layer 33 is disposed between the first conductive layer 34 and the active layer 31. The via hole 32 penetrates the gate insulating layer 41 and the interlayer insulating layer 33 and is located between the source/drain electrode and the active layer 31. That is, the via hole 32 may extend from an upper surface of the interlayer insulating layer 33 to the source/drain overlapping region in the active layer 31, and the via hole 32 may form a groove 50 with the source/drain overlapping region.

Specifically, the source/drain electrode may include a source electrode and a drain electrode, and the source/drain overlapping region may include a source overlapping region and a drain overlapping region. The via hole 32 may include a first via hole 321 and a second via hole 322, wherein the first via hole 321 may extend from the upper surface of the interlayer insulating layer 33 to the source overlapping region, this is, the first via hole 321 is disposed between the source electrode and the source overlapping region. The first via hole 321 may form a first groove 51 with the source overlapping region, a part of the first conductive layer 34 may be disposed on a wall and a bottom of the first groove 51, and a part of the second conductive layer 35 may be disposed in the first groove 51 and in contact with the first conductive layer 34 provided in the first groove 51, thereby achieving electrical connection of the source electrode and the source overlapping region.

The second via hole 322 may extend from the upper surface of the interlayer insulating layer 33 to the drain overlapping region, this is, the second via hole 322 is disposed between the drain electrode and the drain overlapping region. The second via hole 322 may form a second groove 52 with the drain overlapping region, a part of the first conductive layer 34 may be disposed on a wall and a bottom of the second groove 52, and a part of the second conductive layer 35 may be disposed in the second groove 52 and in contact with the first conductive layer 34 disposed within the second groove 52, thereby achieving electrical connection of the drain electrode and the drain overlapping region.

It should be understood that a part of the second conductive layer 35 may be disposed on the interlayer insulating layer 33, and another part of the second conductive layer 35 may be disposed in the groove 50 and in contact with the first conductive layer 34. The second conductive layer 35 may be made of an aluminum material having a high reflectivity, and the first conductive layer 34 may be made of a metal material such as titanium or molybdenum, so that the second conductive layer 35 made of an aluminum material is prevented from directly contacting the source/drain overlapping region of the active layer 31 by the first conductive layer 34, thereby avoiding a short circuit caused by excessive resistance.

It should be understood that, compared with FIG. 1 and FIG. 3, the present embodiment differs from the prior art in that: the second conductive layer 111 in the prior art is not only disposed in the via hole extending to the surface of the active layer 105, but also disposed on the second interlayer insulating layer 109, and a part of the second conductive layer 111 disposed on the second interlayer insulating layer 109 completely shields the third conductive layer 112, so that the lights cannot be directly incident on the third conductive layer 112. Since the second conductive layer 111 is made of titanium or molybdenum material of which the reflectivity is low, and the reflectivity of the array substrate 100 is poor. In this embodiment according to the present application, a part of the first conductive layer 34 is disposed in the groove 50, and another part of the first conductive layer 34 is disposed on the interlayer insulating layer 33. Since the orthographic projection region of the first conductive layer 34 on the substrate 201 is less than the orthographic projection region of the second conductive layer 35 on the substrate 201, the first conductive layer 34 disposed on the interlayer insulating layer 33 shields only a part of the lights incident on the second conductive layer 35, and most of a light-entering side of the second conductive layer can directly receive the lights. Since the conductive layer 35 use the material of an aluminum with high reflectivity, the reflectivity of the array substrate 200 is improved.

It should also be understood that, as shown in FIG. 3, a first portion of the second conductive layer 35 is disposed on the interlayer insulating layer 33, a second portion of the second conductive layer 35 is disposed in the groove 50, and a connection position between the first portion and the second portion of the second conductive layer is located in an opening of the groove 50. In order to prevent the second conductive layer 35 from breaking due to the rigidity of the opening, a part of the first conductive layer 34 may be disposed adjacent to of the opening of the groove 50. Specifically, at least a part of the first conductive layer 34 may be disposed on the interlayer insulating layer, and at least a part of the first conductive layer 34 is connected to the second conductive layer 35 disposed in the groove 50, thereby shielding the second conductive layer 35 at the opening of the groove 50.

However, an orthographic projection region of at least a part of the first conductive layer 34 disposed at the opening of the groove 50 on the substrate 201 is located in an orthographic projection region of the first portion of the second conductive layer 35 on the substrate 201, thereby preventing the reflectivity of the array substrate 200 from being affected due to at least a part of the first conductive layer 34 causing a large barrier to the incident lights from the first portion of the second conductive layer 35.

In addition, the third conductive layer 36 may be disposed on the first portion of the second conductive layer 35. The second conductive layer 35 is made of aluminum material, in order to prevent the aluminum material from forming a small mound at a high temperature, the second conductive layer 35 may be restrained by the third conductive layer 36, so that it is necessary to position an orthographic projection region of the second conductive layer 35 on the substrate 201 in an orthographic projection region of the third conductive layer 36 on the substrate 201. The first conductive layer 34 and the third conductive layer 36 may be made of a same material, for example, a metal material such as titanium or molybdenum. In order to improve the reflectivity of the array substrate 200, the reflectivity of the second conductive layer 35 may be greater than the reflectivity of the first conductive layer 34 and the reflectivity of the third conductive layer 36, that is, the second conductive layer 35 may be made of aluminum.

As can be seen from the above, in the present embodiment, the second conductive layer 35 is provided as an aluminum material having a high reflectivity, and the first conductive layer 34 is provided only in the groove 50 without being provided on the interlayer insulating layer 33 to influence the incident lights from the second conductive layer 35, thereby improving the reflectivity of the array substrate 200. In addition, the third conductive layer 36 is disposed on the second conductive layer 35 to restrain a small mound formed on the second conductive layer 35 using the aluminum material, thereby improving the stability of the array substrate 200.

The array substrate 200 provided in this embodiment may further include a first buffer layer 37, a second buffer layer 38, a fourth conductive layer 39, and a fifth conductive layer 40 to further improve the reflectivity of the array substrate 200. The first buffer layer 37, the second buffer layer 38, the fourth conductive layer 39, and the fifth conductive layer 40 are disposed in the light-reflecting region 203.

The first buffer layer 37 is disposed on the substrate 201, and the second buffer layer 38 is disposed on the first buffer layer 37. The fourth conductive layer 39 is disposed on the substrate 201, and the fifth conductive layer 40 is disposed on the fourth conductive layer 39. The fourth conductive layer 39 and the fifth conductive layer 40 are patterned by a patterning process, such that the fourth conductive layer 39 and the fifth conductive layer 40 are covered in the first buffer layer 37, the fourth conductive layer 39 and the fifth conductive layer 40 are disposed between the substrate 201 and the active layer 31, the fifth conductive layer 40 is disposed on a side of the fourth conductive layer 39 away from the substrate 201, and the reflectivity of the fourth conductive layer 39 is greater than the reflectivity of the fifth conductive layer 40.

In order to improve the reflectivity of the array substrate, the fourth conductive layer 39 may use an aluminum material. However, since the aluminum material may form a small mound at a high temperature, it is necessary to provide the orthographic projection region of the fourth conductive layer 39 on the substrate 201 to be located in the orthographic projection region of the fifth conductive layer 40 on the substrate 201 by means of restraining the fourth conductive layer 39 by the fifth conductive layer 40. The fifth conductive layer 40 may be a metal material such as titanium or molybdenum, and the reflectivity of the fourth conductive layer 39 is greater than the reflectivity of the fifth conductive layer 40, that is, the reflectivity of aluminum is greater than the reflectivity of titanium or molybdenum.

In addition, the array substrate 200 may further include a gate insulating layer 41 and a gate layer 42, wherein the gate insulating layer 41 is disposed on the second buffer layer 38, the active layer 31 is also disposed on the second buffer layer 38 and is patterned by a patterning process, and the active layer 31 is covered the gate insulating layer 41.

The interlayer insulating layer 33 may include a first interlayer insulating layer 331 and a second interlayer insulating layer 332, wherein the first interlayer insulating layer 331 is disposed on the gate insulating layer 41, and the second interlayer insulating layer 332 is disposed on the first interlayer insulating layer 331. The gate layer 42 is disposed on the gate insulating layer 41, and is covered in the first interlayer insulating layer 331. An orthographic projection region of the gate layer 42 on the substrate 201 is located in an orthographic projection region of the active layer 31 on the substrate 201, so that the gate layer 42 is configured as the gate of the thin film transistor in the array substrate 200. The fourth conductive layer 39 and the fifth conductive layer 40 may be configured as a light-shielding layer of the array substrate 200, so that an orthographic projection regions of the fourth conductive layer 39 and the fifth conductive layer 40 on the substrate 201 may be disposed in an orthographic projection region of the active layer 31 on the substrate 201, and the fourth conductive layer 39 and the fifth conductive layer 40 may perform a light-shielding effect on the thin film transistor including the active layer 31.

Further, the array substrate 200 may further include a flat layer 43 disposed on the second interlayer insulating layer 332, a part of the second conductive layer 35 and the third conductive layer 36 are covered in the flat layer 43, and a contact surface between a part of the second conductive layer 35 and the second interlayer insulating layer 332 is a light-entering side of the part of the second conductive layer 332, so that the reflectivity of the array substrate 200 is improved by the second conductive layer made of an aluminum material.

As can be seen from the above, in this embodiment, not only the second conductive layer 35 is provided as an aluminum material having a high reflectivity, but also a part of the first conductive layer 34 disposed on the interlayer insulating layer 33 has a less orthographic projection region on the substrate 201 than the orthographic projection region of the second conductive layer 35 on the substrate 201, so that the first conductive layer 34 does not have an influence on the incident lights from the second conductive layer 35, thereby improving the reflectivity of the array substrate 200. In addition, the reflectivity of the array substrate 200 is further improved by providing the fourth conductive layer 39 as an aluminum material having a high reflectivity.

In addition, the second conductive layer 35 made of aluminum material is retrained to form a small mound by disposing the third conductive layer 36 on the second conductive layer 35, and the fourth conductive layer 39 made of aluminum material is retrained to form a small mound by disposing the fifth conductive layer 40 on the fourth conductive layer 39, thereby improving the stability of the array substrate 200.

Figure 4:
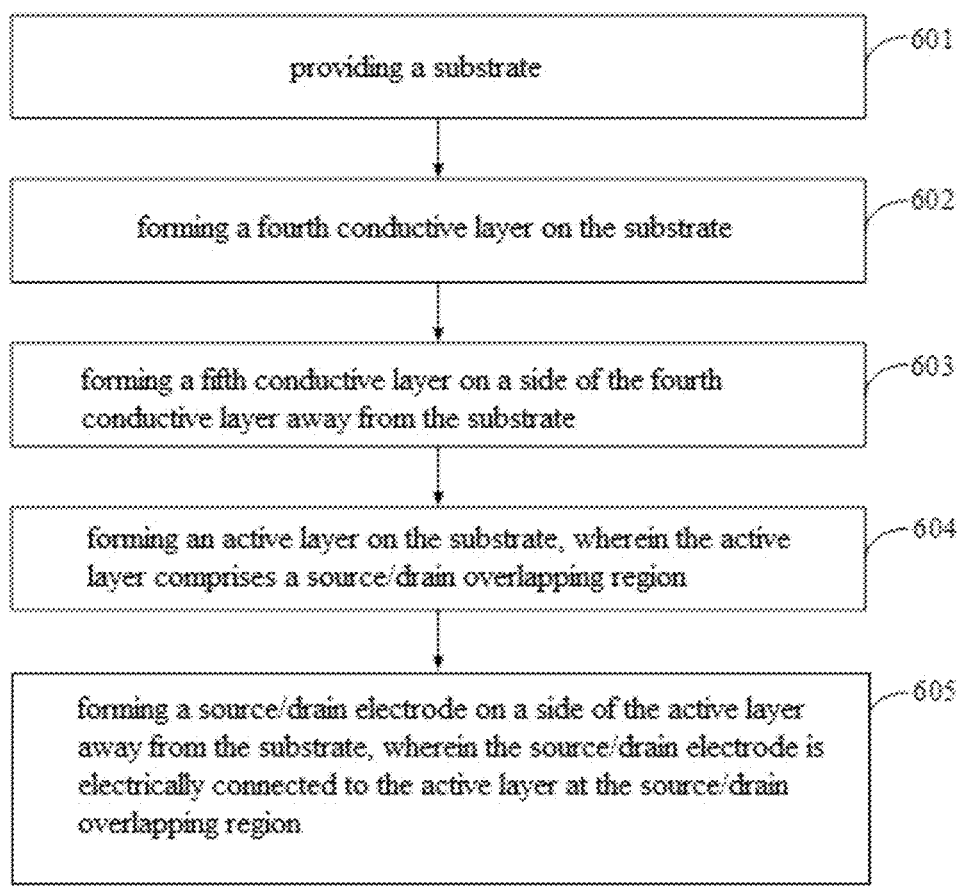
FIG. 4 is a flowchart of a manufacturing method for array substrate according to an embodiment of the present application.

To further explain the improvement of the reflectivity of the array substrate 200, an embodiment of the present application further provides a manufacturing method for array substrate. Referring to FIG. 4, which is a flowchart of a manufacturing method for array substrate according to an embodiment of the present application. The manufacturing method for array substrate may include the following steps.

601, providing a substrate.

References are made to FIG. 2 and FIG. 3, wherein the substrate 201 provided in this embodiment may be a glass substrate or the like.

602, forming a fourth conductive layer on the substrate.

A first buffer layer 37 and a second buffer layer 38 are also formed on the substrate 201. The first buffer layer 37 is disposed on the substrate 201, and the second buffer layer 38 is disposed on the first buffer layer 37. The fourth conductive layer 39 is disposed on the substrate 201.

603, forming a fifth conductive layer on a side of the fourth conductive layer away from the substrate.

The fifth conductive layer 40 is disposed on the fourth conductive layer 39, the fourth conductive layer 39 and the fifth conductive layer 40 are patterned by a patterning process, such that the fourth conductive layer 39 and the fifth conductive layer 40 are covered in the first buffer layer 37, the fourth conductive layer 39 and the fifth conductive layer 40 are disposed between the substrate 201 and the active layer 31, the fifth conductive layer 40 is disposed on a side of the fourth conductive layer 39 away from the substrate 201, and the reflectivity of the fourth conductive layer 39 is greater than the reflectivity of the fifth conductive layer 40.

In order to improve the reflectivity of the array substrate, the fourth conductive layer 39 may use an aluminum material. However, since the aluminum material may form a small mound at a high temperature, it is necessary to provide the orthographic projection region of the fourth conductive layer 39 on the substrate 201 to be located in the orthographic projection region of the fifth conductive layer 40 on the substrate 201 by means of restraining the fourth conductive layer 39 by the fifth conductive layer 40. The fifth conductive layer 40 may be a metal material such as titanium or molybdenum, and the reflectivity of the fourth conductive layer 39 is greater than the reflectivity of the fifth conductive layer 40, that is, the reflectivity of aluminum is greater than the reflectivity of titanium or molybdenum.

604, forming an active layer on the substrate, wherein the active layer comprises a source/drain overlapping region.

It should be understood that the fourth conductive layer 39 and the fifth conductive layer 40 are located between the substrate 201 and the active layer 31.

605, forming a source/drain electrode on a side of the active layer away from the substrate, wherein the source/drain electrode is electrically connected to the active layer at the source/drain overlapping region.

The active layer 31 is disposed on a side of the substrate, and the active layer includes a source/drain overlapping region. The source/drain electrode is disposed on a side of the active layer 31 away from the substrate 201, and is electrically connected to the active layer 31 at the source/drain overlapping region.

The source/drain electrode may include a first conductive layer 34, a second conductive layer 35, and a third conductive layer 36, wherein the first conductive layer 34 is disposed close to the active layer 31, the third conductive layer 36 is disposed on a side of the conductive layer 34 away from the active layer 31, and the second conductive layer 35 is disposed between the first conductive layer 34 and the third conductive layer 36. The light reflectivity of the second conductive layer 35 is greater than the light reflectivity of the first conductive layer 34, and the light reflectivity of the second conductive layer 35 is greater than the light reflectivity of the third conductive layer 36. An orthographic projection region of the first conductive layer 34 on the substrate 201 is less than an orthographic projection region of the second conductive layer 35 on the substrate 201.

The active layer 31 may include a source/drain overlapping region for connecting the source/drain traces, so that electrical connection with the source/drain electrode is achieved by the source/drain traces.

The right-reflecting region 203 may further include a via hole 32, an interlayer insulating layer 33 and a gate insulting layer 41, wherein the gate insulating layer 41 covers the active layer 31, the interlayer insulating layer 33 is disposed on a side of the gate insulating layer 41 away from the active layer 31, and the interlayer insulating layer 33 is disposed between the first conductive layer 34 and the active layer 31. The via hole 32 penetrates the gate insulating layer 41 and the interlayer insulating layer 33 and is located between the source/drain electrode and the active layer 31. That is, the via hole 32 may extend from an upper surface of the interlayer insulating layer 33 to the source/drain overlapping region in the active layer 31, and the via hole 32 may form a groove 50 with the source/drain overlapping region.

Specifically, the source/drain electrode may include a source electrode and a drain electrode, and the source/drain overlapping region may include a source overlapping region and a drain overlapping region. The via hole 32 may include a first via hole 321 and a second via hole 322, wherein the first via hole 321 may extend from the upper surface of the interlayer insulating layer 33 to the source overlapping region, this is, the first via hole 321 is disposed between the source electrode and the source overlapping region. The first via hole 321 may form a first groove 51 with the source overlapping region, a part of the first conductive layer 34 may be disposed on a wall and a bottom of the first groove 51, and a part of the second conductive layer 35 may be disposed in the first groove 51 and in contact with the first conductive layer 34 provided in the first groove 51, thereby achieving electrical connection of the source electrode and the source overlapping region.

The second via hole 322 may extend from the upper surface of the interlayer insulating layer 33 to the drain overlapping region, this is, the second via hole 322 is disposed between the drain electrode and the drain overlapping region. The second via hole 322 may form a second groove 52 with the drain overlapping region, a part of the first conductive layer 34 may be disposed on a wall and a bottom of the second groove 52, and a part of the second conductive layer 35 may be disposed in the second groove 52 and in contact with the first conductive layer 34 disposed within the second groove 52, thereby achieving electrical connection of the drain electrode and the drain overlapping region.

It should be understood that a part of the second conductive layer 35 may be disposed on the interlayer insulating layer 33, and another part of the second conductive layer 35 may be disposed in the groove 50 and in contact with the first conductive layer 34. The second conductive layer 35 may be made of an aluminum material having a high reflectivity, and the first conductive layer 34 may be made of a metal material such as titanium or molybdenum, so that the second conductive layer 35 made of an aluminum material is prevented from directly contacting the source/drain overlapping region of the active layer 31 by the first conductive layer 34, thereby avoiding a short circuit caused by excessive resistance.

It should be understood that, compared with FIG. 1 and FIG. 3, the present embodiment differs from the prior art in that: the second conductive layer 111 in the prior art is not only disposed in the via hole extending to the surface of the active layer 105, but also disposed on the second interlayer insulating layer 109, and a part of the second conductive layer 111 disposed on the second interlayer insulating layer 109 completely shields the third conductive layer 112, so that the lights cannot be directly incident on the third conductive layer 112. Since the second conductive layer 111 is made of titanium or molybdenum material of which the reflectivity is low, the reflectivity of the array substrate 100 is poor. In this embodiment according to the present application, a part of the first conductive layer 34 is disposed in the groove 50, and another part of the first conductive layer 34 is disposed on the interlayer insulating layer 33. Since the orthographic projection region of the first conductive layer 34 on the substrate 201 is less than the orthographic projection region of the second conductive layer 35 on the substrate 201, the first conductive layer 34 disposed on the interlayer insulating layer 33 shields only a part of the lights incident on the second conductive layer 35, and most of a light-entering side of the second conductive layer 35 can directly receive the lights. Since the conductive layer 35 use the material of an aluminum with high reflectivity, the reflectivity of the array substrate 200 is improved.

It should also be understood that, as shown in FIG. 3, a first portion of the second conductive layer 35 is disposed on the interlayer insulating layer 33, a second portion of the second conductive layer 35 is disposed in the groove 50, and a connection position between the first portion and the second portion of the second conductive layer is located in an opening of the groove 50. In order to prevent the second conductive layer 35 from breaking due to the rigidity of the opening, a part of the first conductive layer 34 may be disposed adjacent to of the opening of the groove 50. Specifically, at least a part of the first conductive layer 34 may be disposed on the interlayer insulating layer, and at least a part of the first conductive layer 34 is connected to the second conductive layer 35 disposed in the groove 50, thereby shielding the second conductive layer 35 at the opening of the groove 50.

However, an orthographic projection region of at least a part of the first conductive layer 34 disposed at the opening of the groove 50 on the substrate 201 is located in an orthographic projection region of the first portion of the second conductive layer 35 on the substrate 201, thereby preventing the reflectivity of the array substrate 200 from being affected due to at least a part of the first conductive layer 34 causing a large barrier to the incident lights from the first portion of the second conductive layer 35.

In addition, the third conductive layer 36 may be disposed on the first portion of the second conductive layer 35. The second conductive layer 35 is made of aluminum material, in order to prevent the aluminum material from forming a small mound at a high temperature, the second conductive layer 35 may be restrained by the third conductive layer 36, so that it is necessary to position an orthographic projection region of the second conductive layer 35 on the substrate 201 in an orthographic projection region of the third conductive layer 36 on the substrate 201. The first conductive layer 34 and the third conductive layer 36 may be made of a same material, for example, a metal material such as titanium or molybdenum. In order to improve the reflectivity of the array substrate 200, the reflectivity of the second conductive layer 35 may be greater than the reflectivity of the first conductive layer 34 and the reflectivity of the third conductive layer 36, that is, the second conductive layer 35 may be made of aluminum.

As can be seen from the above, in this embodiment, by providing a substrate, a fourth conductive layer is formed on the substrate, a fifth conductive layer is formed on a side of the fourth conductive layer away from the substrate, and an active layer is formed on the substrate. The active layer includes a source/drain overlapping region, a source/drain electrode is formed on a side of the active layer away from the substrate, and the source/drain electrode is electrically connected to the active layer at the source/drain overlapping region. Not only the second conductive layer 35 is provided as an aluminum material having a high reflectivity, but also a part of the first conductive layer 34 disposed on the interlayer insulating layer 33 has a less orthographic projection region on the substrate 201 than the orthographic projection region of the second conductive layer 35 on the substrate 201, so that the first conductive layer 34 does not have an influence on incident lights from the second conductive layer 35, thereby increasing the reflectivity of the array substrate 200. In addition, the reflectivity of the array substrate 200 is further improved by providing the fourth conductive layer 39 as an aluminum material having a high reflectivity.

In addition, the second conductive layer 35 made of aluminum material is retrained to form a small mound by disposing the third conductive layer 36 on the second conductive layer 35, and the fourth conductive layer 39 made of aluminum material is retrained to form a small mound by disposing the fifth conductive layer 40 on the fourth conductive layer 39, thereby improving the stability of the array substrate 200.

Embodiments of the present application further provide a display panel, wherein the display panel includes an array substrate 200 provided in the above embodiments, a color film substrate, and a liquid crystal layer. The array substrate 200 and the color film substrate are disposed opposite to each other, and the liquid crystal layer is disposed between the array substrate 200 and the color film substrate.

Embodiments of the present application further provide a display device including the display panel provided in the above embodiments. The display device may be a full screen display device. For example, the display device may be a wearable device such as a wrist watch or a wrist strap, alternatively, the display device may be an electronic device such as a mobile phone or a tablet computer. The display device includes a display panel provided in the above embodiments and a backlight module disposed on a light-entering side of the display panel, wherein the backlight module is configured to provide the lights to the display panel.

In the above-described embodiments, the description of each of the embodiments is focused, and for a part not described in detail in some embodiments, reference may be made to the related description of other embodiments.

The array substrate, the manufacturing method for array substrate, the display panel and the display device provided in the embodiments of the present application are described in detail above. The principles and implementation of the present application are described herein by applying specific examples. The description of the above embodiments is only used to help understand the method and the core idea of the present application. Meanwhile, for those skilled in the art, according to the idea of the present application, there will be some changes in specific embodiments and application scope. In conclusion, the contents of the present specification shall not be construed as limiting the present application.

What is claimed is:

1. An array substrate, comprising:
   a substrate;
   an active layer disposed on a side of the substrate, wherein the active layer includes a source/drain overlapping region;
   a source/drain electrode disposed on a side of the active layer away from the substrate and electrically connected to the active layer at the source/drain overlapping region, the source/drain electrode includes a first conductive layer disposed close to the active layer, a third conductive layer disposed on a side of the first conductive layer away from the active layer, and a second conductive layer disposed between the first conductive layer and the third conductive layer;
   wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate;
   a gate insulating layer covered on the active layer; and
   an interlayer insulating layer disposed on a side of the gate insulating layer away from the active layer, wherein the interlayer insulating layer is disposed between the first conductive layer and the active layer; a via hole penetrating through the gate insulating layer and the interlayer insulating layer is provided between the source/drain electrode and the active layer, and the via hole and the source/drain overlapping region form a groove;
   wherein one part of the first conductive layer is disposed in the groove, another part of the first conductive layer is disposed on the interlayer insulating layer, a first part of the second conductive layer is disposed on the interlayer insulating layer and a second part of the second conductive layer is disposed in the groove, and an orthographic projection region of the another part of the first conductive layer disposed on the interlayer insulating layer on the substrate is located in an orthographic projection region of the first part of the second conductive layer on the substrate.

2. The array substrate of claim 1, wherein the source/drain electrode comprises a source electrode and a drain electrode, the source/drain overlapping region comprises a source overlapping region and a drain overlapping region, and the via hole comprises a first via hole and a second via hole; wherein the first via hole is disposed between the source electrode and the source overlapping region, the first via hole and the source overlapping region form a first groove, the one part of the first conductive layer is disposed at a wall and a bottom of the first groove, and the second part of the second conductive layer is disposed in the first groove and is in contact with the first conductive layer disposed in the first groove.

3. The array substrate of claim 2, wherein the second via hole is disposed between the drain electrode and the drain overlapping region, the second via hole and the drain overlapping region form a second groove, the one part of the first conductive layer is disposed at a wall and a bottom of the second groove, and the second part of the second conductive layer is disposed in the second groove and is in contact with the first conductive layer disposed in the second groove.

4. The array substrate of claim 3, wherein no part of the third conductive layer is disposed within the first groove and the second groove.

5. The array substrate of claim 3, wherein the fourth conductive layer and the fifth conductive layer are disposed in a light-reflecting region.

6. The array substrate of claim 1, wherein a light reflectivity of the fourth conductive layer is greater than a light reflectivity of the fifth conductive layer.

7. The array substrate of claim 1, wherein the first conductive layer and the third conductive layer have a same material.

8. The array substrate of claim 1, wherein a material of the first conductive layer and the third conductive layer is a titanium or molybdenum metal material, and a material of the second conductive layer is an aluminum metal material.

9. The array substrate of claim 1, wherein the array substrate further comprises a fourth conductive layer and a fifth conductive layer disposed between the substrate and the active layer, the fifth conductive layer is disposed on a side of the fourth conductive layer away from the substrate.

10. The array substrate of claim 1, wherein an orthographic projection region of the fourth conductive layer on the substrate is located in an orthographic projection region of the active layer on the substrate, and the orthographic projection region of the fourth conductive layer on the substrate is located in an orthographic projection region of the fifth conductive layer on the substrate.

11. A method for manufacturing an array substrate, comprising:
    providing a substrate;
    forming an active layer on the substrate, wherein the active layer comprises a source/drain overlapping region; and
    forming a source/drain electrode on a side of the active layer away from the substrate, wherein the source/drain electrode is electrically connected to the active layer at the source/drain overlapping region, the source/drain electrode includes a first conductive layer disposed close to the active layer, a third conductive layer disposed on a side of the first conductive layer away from the active layer, and a second conductive layer disposed between the first conductive layer and the third conductive layer;
    wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate;
    forming a gate insulating layer covered on the active layer; and
    forming an interlayer insulating layer on a side of the gate insulating layer away from the active layer, wherein the interlayer insulating layer is disposed between the first conductive layer and the active layer; a via hole penetrating through the gate insulating layer and the interlayer insulating layer is provided between the source/drain electrode and the active layer, and the via hole and the source/drain overlapping region form a groove;
    wherein one part of the first conductive layer is disposed in the groove, another part of the first conductive layer is disposed on the interlayer insulating layer, a first part of the second conductive layer is disposed on the interlayer insulating layer and a second part of the second conductive layer is disposed in the groove, and an orthographic projection region of the another part of the first conductive layer disposed on the interlayer insulating layer on the substrate is located in an orthographic projection region of the first part of the second conductive layer on the substrate.

12. A display panel, comprising:
an array substrate;
a color film substrate disposed opposite to the array substrate; and
a liquid crystal layer disposed between the array substrate and the color film substrate;
wherein the array substrate comprises:
  a substrate;
  an active layer disposed on a side of the substrate, wherein the active layer includes a source/drain overlapping region;
  a source/drain electrode disposed on a side of the active layer away from the substrate and electrically connected to the active layer at the source/drain overlapping region; wherein the source/drain electrode includes a first conductive layer disposed close to the active layer, a third conductive layer disposed on a side of the first conductive layer away from the active layer, and a second conductive layer disposed between the first conductive layer and the third conductive layer; wherein a light reflectivity of the second conductive layer is greater than a light reflectivity of the first conductive layer, and the light reflectivity of the second conductive layer is greater than a light reflectivity of the third conductive layer; wherein an orthographic projection region of the first conductive layer on the substrate is less than an orthographic projection region of the second conductive layer on the substrate;
  a gate insulating layer covered on the active layer; and
  an interlayer insulating layer disposed on a side of the gate insulating layer away from the active layer, wherein the interlayer insulating layer is disposed between the first conductive layer and the active layer; a via hole penetrating through the gate insulating layer and the interlayer insulating layer is provided between the source/drain electrode and the active layer, and the via hole and the source/drain overlapping region form a groove;
  wherein one part of the first conductive layer is disposed in the groove, another part of the first conductive layer is disposed on the interlayer insulating layer, a first part of the second conductive layer is disposed on the interlayer insulating layer and a second part of the second conductive layer is disposed in the groove, and an orthographic projection region of the another part of the first conductive layer disposed on the interlayer insulating layer on the substrate is located in an orthographic projection region of the first part of the second conductive layer on the substrate.

13. The display panel of claim 12, wherein the source/drain electrode comprises a source electrode and a drain electrode, the source/drain overlapping region comprises a source overlapping region and a drain overlapping region, and the via hole comprises a first via hole and a second via hole; wherein the first via hole is disposed between the source electrode and the source overlapping region, the first via hole and the source overlapping region form a first groove, the one part of the first conductive layer is disposed at a wall and a bottom of the first groove, and the second part of the second conductive layer is disposed in the first groove and is in contact with the first conductive layer disposed in the first groove.

14. The display panel of claim 13, wherein the second via hole is disposed between the drain electrode and the drain overlapping region, the second via hole and the drain overlapping region form a second groove, the one part of the first conductive layer is disposed at a wall and a bottom of the second groove, and the second part of the second conductive layer is disposed in the second groove and is in contact with the first conductive layer disposed in the second groove.

15. The display panel of claim 14, wherein no part of the third conductive layer is disposed within the first groove and the second groove.

16. The display panel of claim 14, wherein the fourth conductive layer and the fifth conductive layer are disposed in a light-reflecting region.

17. The display panel of claim 12, wherein a light reflectivity of the fourth conductive layer is greater than a light reflectivity of the fifth conductive layer.

18. The display panel of claim 12, wherein the first conductive layer and the third conductive layer have a same material.

19. The display panel of claim 12, wherein a material of the first conductive layer and the third conductive layer is a titanium or molybdenum metal material, and a material of the second conductive layer is an aluminum metal material.

20. A display device, comprising:
a display panel of claim 12; and
a backlight module disposed on a light-entering side of the display panel.

* * * * *